United States Patent [19]

Krikorian et al.

[11] 4,086,555
[45] Apr. 25, 1978

[54] PHOTOCONDUCTIVE SENSOR

[75] Inventors: Esther Krikorian, Claremont; Michael J. Crisp, Placentia, both of Calif.

[73] Assignee: General Dynamics Corporation, Pomona, Calif.

[21] Appl. No.: 690,463

[22] Filed: May 27, 1976

[51] Int. Cl.² ............................................. H01L 31/08
[52] U.S. Cl. ................................. 338/15; 204/192 P; 357/30
[58] Field of Search ............... 338/15, 18; 204/192 F, 204/192 P; 357/30

[56] References Cited

U.S. PATENT DOCUMENTS 3,961,998   6/1976   Scharnhorst et al. ................. 357/30

OTHER PUBLICATIONS

C. Corsi, $Pb_{1-x}Sn_xTe$ Layers by R.F. Multicathode Sputtering, Journal of Applied Physics, vol. 45, No. 8, Aug. 1974, pp. 3467–3471.

C. Corsi et al., $Pb_xSn_{1-x}Te$ Epitaxial Layers by R.F. Multicathode Sputtering, (p) C.N.R. Laboratorio Elettronica Stato Solido–GNS.M. Rome, Italy (9/73).

C. Corsi et al., Infrared Detector Arrays by R.F. Sputtering, Infrared Physics, 1972, vol. 12, pp. 271–275, Pergamon Press in Great Britain.

I. Melngailis et al., Photovoltaic Effect in $Pb_xSn_{1-x}Te$ Diodes, Applied Physics Letters, vol. 9, No. 8, 10/15/66, pp. 304–305.

K. W. Nill et al., Laser Emission from Metal–Semiconductor Barriers on PbTe and $Pb_{.8}Sn_{.2}Te$, Applied Physics Letters, vol. 16, No. 10, 5/15/70, pp. 375–377.

Primary Examiner—C. L. Albritton
Attorney, Agent, or Firm—Henry M. Bissell; Edward B. Johnson

[57] ABSTRACT

An improved photoconductive sensor is provided which includes a substrate of calcium fluoride or barium fluoride in monocrystalline form upon which has been sputtered under controlled conditions a thin unannealed monocrystalline film having the formula $Pb_{1-x}Sn_xTe$ where $x =$ about 0–0.3. The conditions under which the film is deposited are controlled so that the film exhibits a cutoff wavelength between about 6$\mu$m and about 15$\mu$m, a photoconductive responsivity which may be as high as up to about $10^3$V/watt at 77° K and a detectivity peak value which may be as high as up to about $1.5 \times 10^{10}$cm-Hz$^{1/2}$/watt at frequencies above the 1/f noise frequency. The film also exhibits a fast response time of less than about 100 nanoseconds and is usually present in a thickness, for example about 1–2$\mu$m, corresponding to high quantum efficiency and minimal contribution of unexcited film to detector noise. Moreover, the film has a low carrier concentration, a predetermined carrier type, and a high Hall mobility and is stable over long periods of time. The carrier concentration is as low as about $10^{14}$cm$^{-3}$, the film thickness is usually about 1–2 $\mu$m and the film composition is about stoichiometric. In order to provide the sensor with these characteristics, the film is deposited at a selected temperature between about 220° and about 350° C. in argon, preferably also in the presence of a small amount of dopant gas selected from nitrogen and oxygen and utilizing a film growth rate of between about 0.1 and 3.0$\mu$m/hr and alternatively also utilizing a voltage bias to the substrate between about +30 volts and about −30 volts and adjacent the critical switching voltage at which the carrier type changes from $p$ to $n$ or $n$ to $p$. Accordingly, minimal carrier concentration and high mobility as well as desired carrier type are provided. The finished sensor has a noise level approaching Johnson noise and can be easily incorporated into improved infrared photoconductive devices.

15 Claims, 8 Drawing Figures

PHOTOCONDUCTIVE SENSOR

BACKGROUND OF THE INVENTION

1. Field of the Invention

The present invention generally relates to sensors and more particularly to photoconductive sensors having improved characteristics.

2. Description of the Prior Art

Photoconductive crystals of lead-tin telluride have been grown by a closed-tube vapor-growth method with subsequent annealing to form p-n junctions, as described in an article entitled "High-Performance 8-14-$\mu$m $Pb_{1-x}Sn_xTe$ Photodiodes" by Kennedy et al, *Proc. IEEE*, January 1975. However, the utilization of such devices as sensors have been somewhat limited because, even at a low temperature such as 77° K, they usually exhibit a peak photoconductive response of only a very few volts per watt, typically about 2 volts per watt or less. This response is insufficient for most sensor purposes. The observed low photoconductive response is the case even for the most carefully prepared and annealed PbSnTe of the highest quality single crystal structure. Economical high sensitivity photoconductive sensors are desired for various applications in modern technology and current efforts are being made to find convenient inexpensive ways of producing high quality photoconductive materials in film form. Thus far, it has been found to be very difficult and expensive to prepare films having high photoconductive sensitivity as well as high structural strength required in various sensor applications. Accordingly, it would be highly desirable to be able to provide high structural quality stable photoconductive sensors exhibiting improved photoconductive responsivity and detectivity.

SUMMARY OF THE INVENTION

The improved photoconductive sensor of the present invention exhibits desired improved photoconductive responsivity over substantial periods of time and is structurally stable. The sensor can be produced inexpensively and rapidly. It incorporates a thin monocrystalline film of lead-tin telluride of a predetermined composition disposed on a substrate of monocrystalline barium fluoride or calcium fluoride or the like. The Abstract above sets forth the general characteristics of the sensor and the manner in which it is prepared. Thus, a thin film of $Pb_{1-x}Sn_xTe$ where $x \times$ about 0–0.3 is sputtered to a controlled thickness onto the selected substrate in the presence of argon sputtering gas, and usually with a minor concentration of a selected dopant gas such as oxygen or nitrogen, so that the photoconductive responsivity of the film is high. When the sputtering is conducted with the substrate under a bias voltage in a range between about +30 and −30 volts the film exhibits further improved characteristics. The film composition can be controlled by the deposition parameters, as can the carrier type, carrier concentration and Hall mobility, the responsivity, detectivity and low noise level. The result is an inexpensive, durable, high responsivity, high detectivity sensor comprising an unannealed sputtered monocrystalline PbSnTe thin film of about 1–2$\mu$m thickness on the monocrystalline substrate. The composite device is structurally strong and stable and can be tailored in properties to meet selected requirements.

BRIEF DESCRIPTION OF THE DRAWINGS

A better understanding of the present invention may be had from a consideration of the following detailed description, taken in conjunction with the accompanying drawings, in which.

DESCRIPTION OF THE PREFERRED EMBODIMENT

Figure 1:
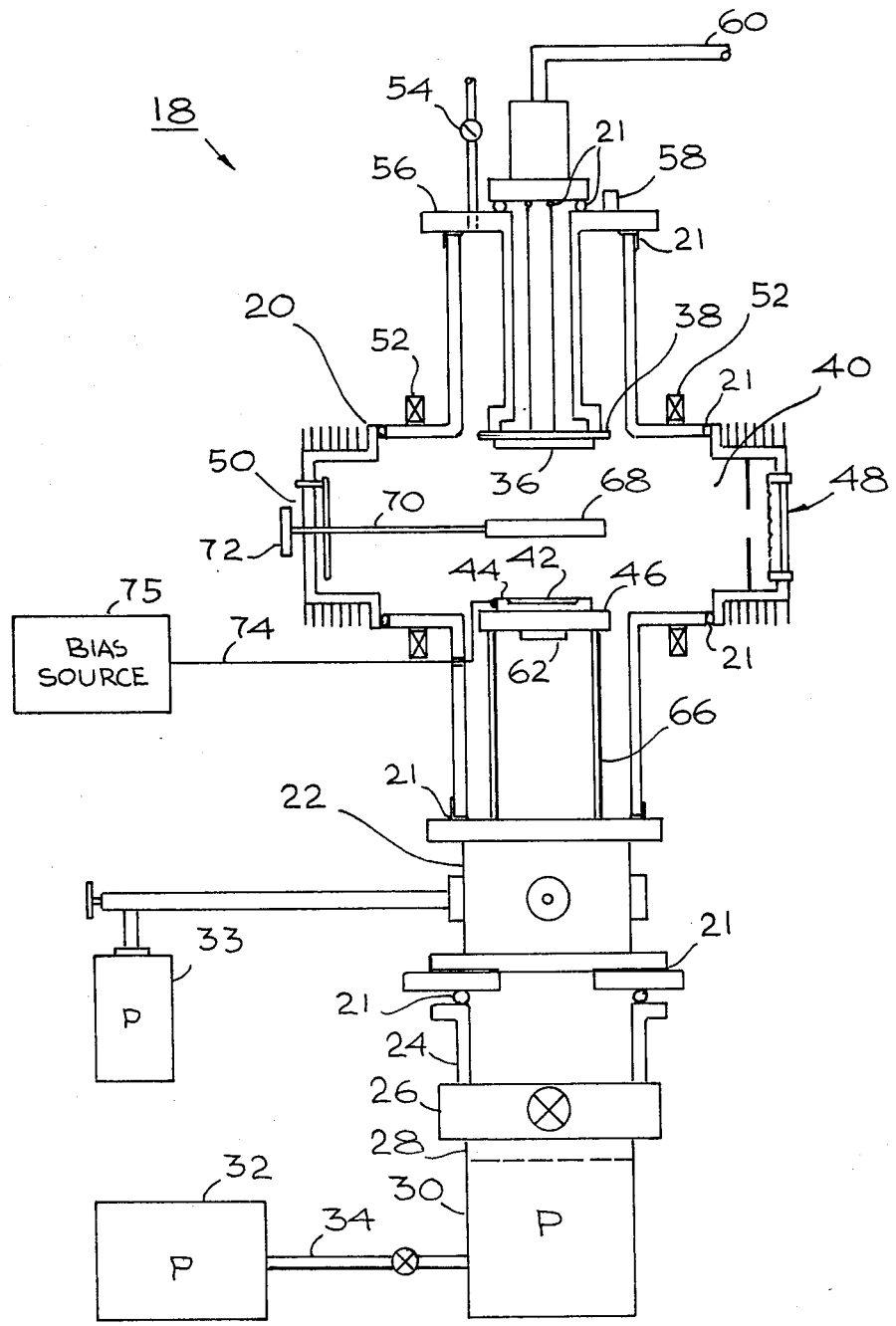
FIG. 1 is a schematic front elevation of a typical supported discharge or triode sputtering device which can be used in carrying out the present method.

Now referring more particularly to FIG. 1 of the accompanying drawings, a typical device is schematically depicted for carrying out supported discharge sputtering in accordance with one embodiment of the present method. In this regard, a supported discharge sputtering apparatus 18 is shown which has a cruciform-shaped reaction chamber 20 of, for example, about 6-inch-diameter cylinders, fabricated of high temperature glass, such as Pyrex type glass, or quartz or the like. It will be understood that chamber 20 and all components therein are maintained contaminant free. Moreover, high purity substrates, targets and gases are introduced, the target is sputter etched in-situ and the substrates thermally etched in-situ, both under high vacuum condition (about $10^{-7}$ torr) prior to initiation of deposition so that in chamber 20 reproducible high purity films are obtained through the use of the present method, more particularly described hereinafter. Thus, chamber 20 is sealed by suitable metal gaskets generally designated 21 and is disposed upon a ported collar 22 which is in turn disposed upon and sealed to a manifold 24 leading from and separated by a gate valve 26 and cryogenic trapping baffle 28 from a turbo-molecular or water-cooled diffusion pump 30, a mechanical foreline pump 32, a cryogenic roughing pump 33 and suitable interconnecting lines and valving generally designated 34. The pumps are designed to lower the pressure in chamber 20 to the low $10^{-7}$ torr range. A typical operating background pressure in the chamber in carrying out the method is about $1 \times 10^{-7}$ torr.

A source or target 36 having the formula $Pb_{1-x}Sn_xTe$, where $x$ may vary between about 0 and 0.3, is disposed and held in a horizontal position in a vertically movable holder 38 at the top of the wide horizontal cylinder section 40 in chamber 20, a predetermined but adjustable distance, usually of about 6 cm, directly above and parallel to selected single crystal substrates 42. Substrates 42 are disposed in a horizontal tantalum or other suitable low sputtering metal holder 44 on a receiving surface 46. A tungsten thermionic emitter 48 is located at one end of section 40 and a low voltage anode 50 is located at the opposite end of section 40, the emitter 48 and anode 50 forming with target 36 the triode sputtering mechanism of device 18. Two focusing magnets 52 are disposed at opposite sides of section 40 between emitter 48 and anode 50. In utilizing apparatus 18, a voltage is applied to target 36. This voltage can either be alternating current or direct current. Since the target material 36 is electrically conductive, the direct current mode is preferred and is usually maintained by a direct current supply with a maximum 10 Kv, 50 ma capacity. After the chamber 20 is evacuated to background pressure level of about $1 \times 10^{-7}$ torr by means of pumps 32, 33 and 34, high purity $O_2$ or $N_2$ gas is introduced by means of the controlled leak 53 into the chamber 20. The $O_2$ or $N_2$ gas flow rate is adjusted and stabilized such that the pressure in the chamber stabilizes at a selected pressure in the range from about $1 \times 10^{-7}$ torr to about $10^{-4}$ torr above the background pressure as measured by an ion gauge or equivalent gauge (not shown).

Ultra high purity argon gas, or in some instances other suitable gas, for example, neon, after passing through a gas purifier (not shown) enters chamber 20 through a controlled leak line and valve generally designated 54 in the top plate 56 of chamber 20. The gas is added to chamber 20 only after chamber 20 has been evacuated to the previously indicated low pressure (e.g. about $2 \times 10^{-7}$ torr) by means of pump 30, pump 32 and pump 33. The gas thus introduced into chamber 20 through the leak line and valve 54 can be measured through a suitable gauge (not shown) attachable through a connector 58 in top plate 56 of chamber 20. The pressure of the argon gas in chamber 20 generally is in the range of about 0.5–5$\mu$m. A diffuse plasma is produced which extends between the thermionic emitter 48 and low voltage anode 50 in a chamber 20 and also between target 36 and substrate 42.

The target 36 is water-cooled, as through a line 60, passing to target holder 38. The temperature of the substrates 42 can be easily controlled within desired limits, through the use of a heater 62 disposed immediately below surface 46 and powered through suitable connections passing through port or collar 22. It will be noted that surface 46 is adjustable vertically by means of a movable support stand 66 on which it rests.

A push-pull shutter 68 is interposed directly between target 36 and the substrates 42 and is adjustable by means of a control rod 70 and vernier type control knob 72 external of chamber 20. Shutter 68 permits a plurality of simultaneous experiments, if desired, to be carried out after a single pump-down of chamber 20. Thus, for example, substrate holder 44 can be designed to accommodate nine separate substrates 42 arranged in three rows. Shutter 68 can be adjusted to permit exposure of one, two or all rows of the substrates (and thus three, six or all nine substrates) to sputtering deposition at one time and under one to three sets of conditions.

Substrate bias control can be utilized via a line 74 from source 75 to apply a voltage of a given polarity to metal substrate holder 44. For this purpose holder 44 is electrically isolated from surface 46 by disposing a plurality of insulators, for example in the form of ceramic standoffs or rings (not shown), between holder 44 and surface 46 and the shutter 68 is grounded to avoid floating potentials.

Target Preparation

In order to carry out the method of the present invention, it is necessary to prepare a suitable target such as target 36. As previously indicated, the target has a formula $Pb_{1-x}Sn_xTe$ where $x$ may vary between 0.0–0.3. It can be prepared either from the elements lead, tin and tellurium, all of a high degree of purity, for example 6 N purity or the like, or from two compounds in equally purified form, PbTe and SnTe. The preparation of the targets typically involves reacting the elements or the indicated compounds in the desired ratios in a clean quartz reaction vessel sealed under vacuum. Special sealing flasks can be selected for the reactor vessel so as to form the target into the desired shape. Usually, the target-forming reaction is carried out at about 1000° C, for about 6 hours while the reaction vessel is disposed in a vacuum furnace, after which the thus-formed target is cooled at a required slow cooling rate of between approximately 200°–400° C per hour or the like. After the target has cooled, it can be removed from the reaction vessel, and can be shaped, as by lapping, and then cleaned, as by electrochemical etching or the like, well known in the art, in order to provide it with a clean shiny surface. Target 36 can then be attached to holder 38 in part comprising, for example, a high purity copper backplate, as by soldering, utilizing a conductive silver epoxy to provide good electrical and thermal contact but selecting the location of the epoxy so that it will not be exposed to the sputtering plasma and thus cause contamination of the source or deposited film.

Substrate Preparation

In order to carry out the present method it is also necessary to provide the suitable substrate 42 in single crystal form. Any suitable substrate capable of withstanding the operating temperatures encountered by substrate 42 during the sputtering deposition can be used. For example, single crystal rods of calcium fluoride, $CaF_2$, and barium fluoride, $BaF_2$, in either (100) or (111) crystal direction can be used as the starting material. In these cases, the (111) orientated rod material is cleaved in the (111) plane into wafers of desired thickness, typically about 0.050 inches while the (100) orientated material is cut with a diamond saw into wafers of the desired thickness. The (100) surfaces can be checked for orientation by cleaving the crystal slices in two different directions and measuring the angle between the cleavage plane and the cutting plane. The resulting wafers are then lapped or otherwise shaped on a mechanical lapping wheel or the like with successively finer grinding compounds ranging from about 5$\mu$ to about 0.5$\mu$. They then can be polished on a silk-covered polishing wheel or the like to provide the substrate with a finished shape and polished form.

In accordance with one embodiment of the method of the present invention, the substrate or substrates 42, as the case may be, is or are placed into the tantalum or other low sputter yield metal substrate holder 44 in device 18 and the target 36 is attached in the previously indicated manner to holder 38.

The Deposition Process

After insertion of the substrate(s) 42, the substrate 42-to-target-36 distance is adjusted usually to about 6 cm, and reaction chamber 20 is evacuated to a background pressure of about $1 \times 10^{-7}$ torr or below. Thereafter, carefully monitored, high purity $O_2$ or $N_2$ is introduced through the controlled leak 53 at a flow rate producing a preselected pressure in the chamber 20 having a range between $10^{-7}$ torr to $10^{-4}$ torr above the background pressure. Then, ultra high purity argon is introduced into chamber 20 through line and valve 54 to a selected total pressure between 0.5μm and 5μm. The previously described triode system, preferably operating in a direct current mode, is then activated to effect the sputtering deposition of target material 36 as a single crystal film on substrate 42, with the diffuse argon plasma disposed between emitter 48 and anode 50, target 36 and substrate 42. Target 36 is subjected to a controlled, preferably direct current, voltage to regulate the film growth rate on substrate 42 while the temperature of substrate 42 is kept at a desired temperature by heater 62 to assure the film is single crystal in nature. The concentration of sputtering gas is constantly controlled by means of a needle valve (not shown) and monitored by vacuum gauges and the like (not shown) to keep it in the desired range so that the method proceeds smoothly until the desired thickness of film is deposited, for example, between about 0.01μm and about 10.0μm. It will be understood that any suitable film thickness can be obtained. However, thin films of up to about 5μm are usually desired for sensing systems. The film has the composition $Pb_{1-x}Sn_xTe$ wherein $x$ can range from 0.0 to about 0.3.

Figure 2:
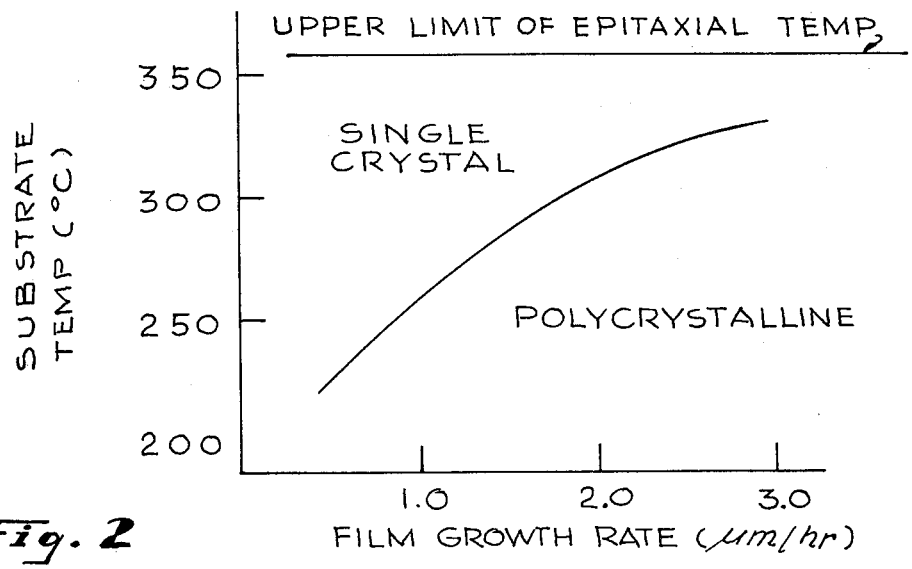
FIG. 2 is a graph showing substrate temperature plotted against selected PbSnTe film growth rates, and delineating typical conditions for producing single-crystal, selected PbSnTe films from a given target having infrared sensitivity.

Now referring more particularly to FIG. 2 of the accompanying drawings, a graph is presented which shows the range of substrate temperatures, controlled as previously indicated by heater 62 and the range of film growth rates that can be used to select conditions for growing film of $Pb_{1-x}Sn_xTe$ compositions between $x = 0.0$ and 0.3 on substrate 42 so that the film so deposited will be monocrystalline. FIG. 2 shows that these ranges are about 225° to 350° C for the substrate temperatures and about 0.1μm per hour to 3μm per hour for the growth rate. Any combination of substrate temperatures and growth rates that fall within the boundaries indicated in FIG. 2 can be selected to achieve the desired monocrystalline film structure. Thus, FIG. 2 provides the criteria for operating device 18 so that the present method yields the desired single crystal infrared sensitive films. These criteria can vary slightly with the sputtering environment, such as sputtering gas pressure and ion beam energy, but can be equally well defined for any environment.

Figure 3:
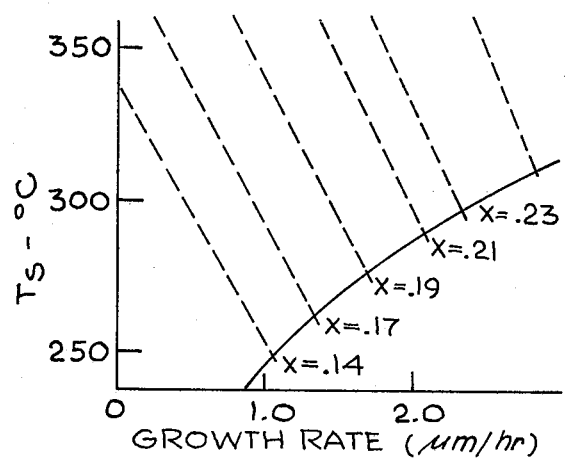
FIG. 3 is a graph showing substrate temperature against film growth rate and delineating the temperature rate conditions leading to specific film compositions.

Now referring more particularly to FIG. 3 of the accompanying drawings, a graph is presented which shows that within the temperature and growth rate ranges yielding single crystalline film growth, as delineated in FIG. 2, specific combinations of substrate temperatures and film growth rates can be reliably preselected to grow single crystal film of desired composition $Pb_{1-x}Sn_xTe$, where $x$ may range from 0.0 to 0.30. As shown in FIG. 3, the dashed lines define combinations of temperatures and rates which yield specific film compositions. For example, a substrate temperature of about 300° C and a growth rate of about 0.4μm/hr yields a single crystal film of composition $Pb_{0.86}Sn_{0.14}Te$ as does a substrate temperature of 250° C and a growth rate of about 0.9μm/hr, while a substrate temperature of 300° C and a growth rate of about 2μm/hr produces a film of composition $Pb_{0.78}Sn_{0.22}Te$. As shown in FIG. 3 the composition values in the examples are feasible with a single target of composition $Pb_{0.80}Sn_{0.20}Te$. Similar composition curves (dashed lines) can be defined with targets of different composition.

Having preselected the growth rate and temperature conditions by means of the criteria for crystallinity and composition, the present method can then be applied to control the electrical and photoconductive film properties without affecting the crystallinity and composition criteria defined by FIG. 2 and FIG. 3.

Dopant Gas Modification Method

The present method is used to preselect the electrical and electro-optical film properties of films having the composition $Pb_{1-x}Sn_xTe$ where $x$ may vary from 0.0 to about 0.3 through the use of controlled minor concentrations of selected dopant gas. The selected dopant gas affects the carrier concentration and carrier mobility of the deposited film and the carrier type. The method can be carried out utilizing, for example, device 18 where in addition to the argon, high purity oxygen or nitrogen gas is fed into the reaction chamber 20 in accordance with the above indicated procedure.

It has been found that when high purity oxygen is used as the dopant gas in accordance with the above indicated procedures, the PbSnTe film formed during the sputtering process is p-type in nature and, up to a limiting partial pressure of $O_2$, the carrier concentration in said films decreases with increasing partial pressures of $O_2$. Conversely, it has been found that when high purity nitrogen is used as the dopant gas in accordance with the above indicated procedures, the PbSnTe film formed during the sputtering process is n-type in nature and the carrier concentration in said films decreases with increasing partial pressures of $N_2$.

It has further been found that when oxygen of high purity is to be used as the dopant gas, it should be present in a partial pressure concentration not to exceed about $5 \times 10^{-6}$ torr. The partial pressure value of $5 \times 10^{-6}$ torr for the oxygen represents a useful upper limit for that gas inasmuch as partial pressures of this gas above this limit may result in an undesirably large increase in p-type carrier concentration in the deposited PbSnTe film. Moreover, above this limit, the integrity of the sputtered film deteriorates, film regions with polycrystalline structure occur, the film composition can be significantly changed from that defined by the substrate temperature and growth rate and the film may exhibit more than one compositional phase.

Correspondingly it has been found that when nitrogen of high purity is to be used as the dopant gas instead of oxygen, it has a useful partial pressure concentration range of up to about $1 \times 10^{-5}$ torr. As the partial pressure of nitrogen is increased above the $1 \times 10^{-5}$ torr limit, the structure of the sputtered film deteriorates and the composition of the film changes as in the case of the use of too high a partial pressure of oxygen.

Figure 4:
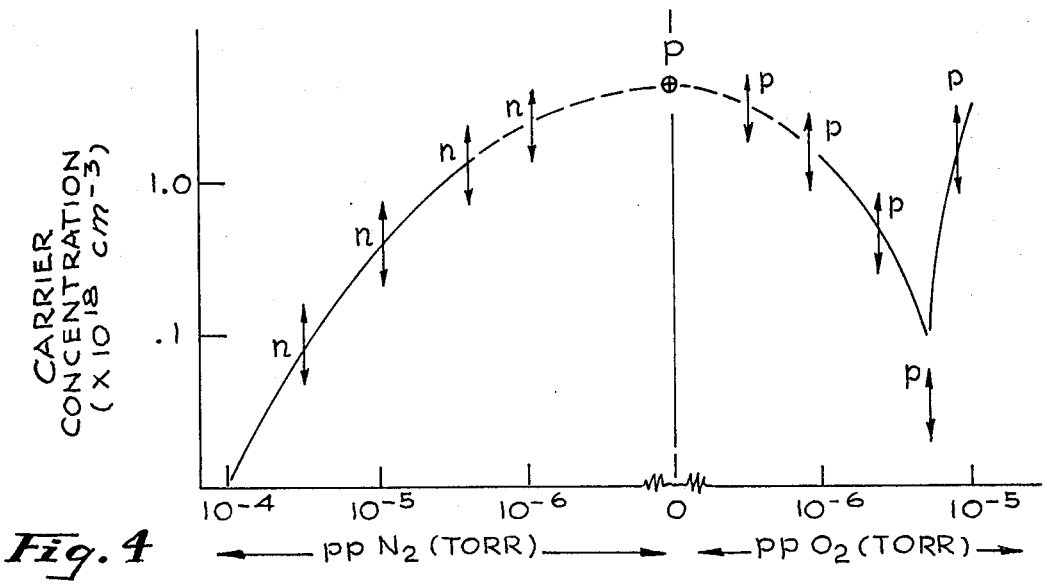
FIG. 4 is a dual graph plotting carrier concentration of deposited selected PbSnTe film against the partial pressure of nitrogen (left-hand graph) and against the partial pressure of oxygen (right-hand graph)

Now referring more particularly to FIG. 4, a graph is shown representing a typical example of the behavior discovered and discussed above when small partial pressures of high purity $O_2$ and $N_2$ are added to the sputtering gas, in particular high purity argon, during the sputtering of PbSnTe film. As indicated in the graph, showing partial pressures of oxygen and nitrogen versus carrier concentration, a film deposited without partial pressures of either dopant gas is p-type and has a carrier concentration in excess of $10^{18}$ cm$^{-3}$, for the substrate temperature of 330° C and the film growth rate of 0.8μm/hr used in all experiments resulting in the data shown in FIG. 4. The target, in all cases, had a composition Pb$_{0.75}$Sn$_{0.25}$Te, leading to films of composition Pb$_{0.79}$Sn$_{0.21}$Te with said selected temperature and rates.

Upon reviewing the right-hand portion of the graph of FIG. 4, it will be noted that all partial pressures of oxygen cause the sputtered film to be p-type but that the higher the partial pressure of oxygen up to a partial pressure of about 5 × 10$^{-6}$ torr, the lower the carrier concentration in the film. In the illustrated case the minimum carrier concentration is about 4 × 10$^{-16}$ cm$^{-3}$, an exceptionally low value for PbSnTe film or crystal without annealing. As the partial pressure of oxygen is increased above the value of about 5 × 10$^{-6}$ torr, the deposited film is p-type but the carrier concentration increases rapidly as the partial pressure of oxygen increases above about 5 × 10$^{-6}$ torr. This is associated with the above indicated degradation of film structure, variation in film composition and occurrence of multiphase structure of the film at partial pressures of oxygen in excess of about 5 × 10$^{-6}$ torr.

Upon reviewing the left-hand portion of the diagram of FIG. 4, it will be noted that all partial pressures of nitrogen listed in FIG. 4 cause the sputtered film to be n-type instead of p-type, but that the higher the partial pressure of nitrogen up to at least 10$^{-4}$ torr, the lower the n-type carrier concentration in the film. In the illustrated case the carrier concentration in film deposited with a partial pressure of nitrogen near 10$^{-4}$ torr, the carrier concentration is below about 3 × 10$^{-16}$ cm$^{-1}$. However, at partial pressures of nitrogen above about 1 × 10$^{-5}$ torr, film structure degradation and uncontrolled composition changes were observed.

Moreover, it was found that, as is typically the case in PbSnTe, the carrier mobility increases with decreasing carrier concentration. In the particular set of examples given in FIG. 4, the hole mobility ($\mu$h) ranges from about 2500 cm$^2$/volt-sec in film deposited without dopant gas additives and a carrier concentration of about 3 × 10$^{18}$ cm$^{-3}$ to about 7000 cm$^2$/volt-sec and a carrier concentration of 2 × 10$^{17}$ cm$^{-3}$ in film deposited with an oxygen partial pressure of about 2 × 10$^{-6}$ torr. Similarly, the electron mobility ($\mu$e) ranges from about 5000 cm$^2$/volt-sec in film deposited with a nitrogen partial pressure of about 10$^{-6}$ torr and a carrier concentration of about 1.5 × 10$^{18}$ cm$^{-3}$ to about 9000 cm$^2$/volt-sec in film deposited with a nitrogen partial pressure of slightly below 1 × 10$^{-5}$ torr and a carrier concentration of about 1 × 10$^{17}$ cm$^{-3}$. The hole and electron mobilities in films sputtered in the presence of dopant gases O$_2$ and N$_2$ are slightly below those found in films sputtered without O$_2$ and N$_2$ having equivalent carrier concentrations. However, those differences are insignificant for most device applications. Presently, the inventors attribute the reduction in carrier concentration with increasing partial pressures of dopant gases to a carrier compensation mechanism, and the decrease in mobility, relative to mobilities in film sputtered without dopant gas, to a corresponding scattering mechanism by neutral scattering centers. The latter is supported by Hall mobility measurements carried out by the inventors to temperatures as low as 10° K which show a $T^{-5/2}$ mobility variation with temperature to below 77° K indicating pure phonon scattering to that point. At lower temperatures the mobility deviates slightly from $T^{-5/2}$ until the mobility becomes nearly invariable with temperature below 30° K.

Voltage Biasing of Substrate

When a suitable bias voltage of selected sign is applied from a bias source 75 via lead 74 to the substrate such as 42, after isolating the substrate (and holder) from its support, and the present method is otherwise carried out utilizing the dopant gas as described above, the electrical effects which would be obtained through the use of the dopant gas as described above can be modified. The biasing voltage may vary from about +30 volts to about −30 volts, as applied to the isolated substrate, the strength and sign thereof affecting the results obtained.

Figure 5:
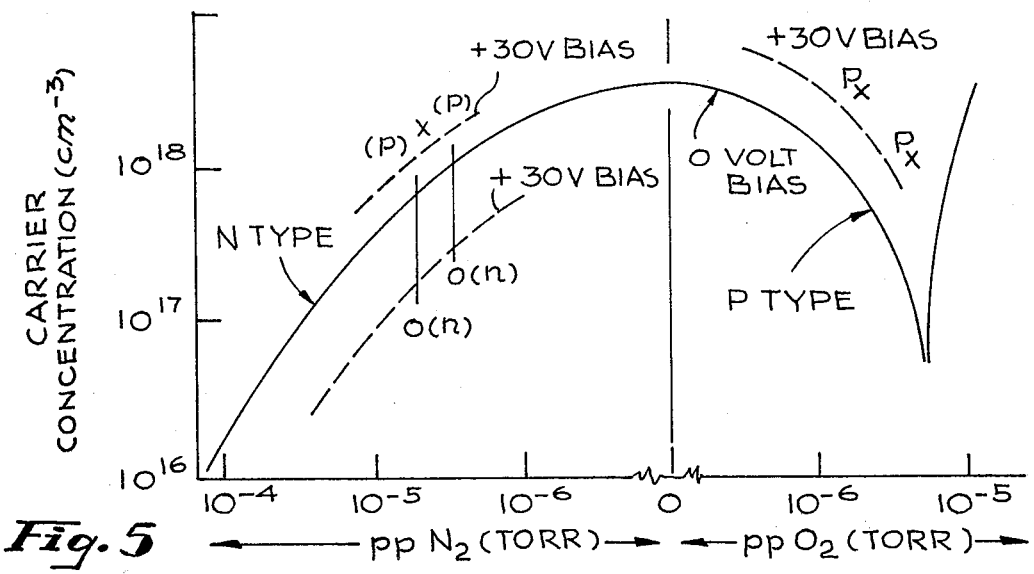
FIG. 5 is a dual graph similar to that of FIG. 4, but depicting the effects of a bias voltage of +30 volts applied to the substrate during deposition of the selected PbSnTe in the presence of oxygen or nitrogen.

Now referring more particularly to FIG. 5 of the accompanying drawings, the effects of a substrate bias voltage of +30 volts are depicted in dotted line curves, as distinguished from the solid line curves of FIG. 5 for films deposited under the same conditions except with the absence of bias voltage. The solid line curves are identical to those of FIG. 4 and represent the same films. The bias voltage of +30 volts affects the carrier concentration of the deposited film of FIG. 5. In the case of oxygen doped film in FIG. 5, the application of the +30 volts substrate bias results in p-type films exhibiting p-type carrier concentrations somewhat higher than those of films deposited without any substrate bias.

When a substrate bias is applied in the presence of nitrogen as the dopant gas during the deposition of the films of FIG. 5, both p- and n-type films can be deposited instead of only n-type films shown in FIG. 4, i.e. nitrogen doped films deposited in the absence of substrate bias. Moreover, the n-type carrier concentrations (dotted line curve in FIG. 5) are consistently below those measured in films deposited without any substrate bias (solid line curve of FIG. 5). Thus at nitrogen partial pressures in the range of about 5 × 10$^{-4}$ torr to about 3 × 10$^{-5}$ torr (dotted line curve), n-type films are produced having lower n-carrier concentrations than with the comparable but unbiased system (solid line curve). Other bias voltages within the range of −30 to about +30 volts produce predictable, similar, systematically controllable variations in the nature and carrier concentration of electrical properties of the film sputtered in the presence of argon plus the described partial pressures of oxygen or nitrogen dopant gas.

Accordingly, the present method of utilizing the oxygen or nitrogen doping gas can be carried out with or without a substrate voltage bias and provides a simple control over the electrical characteristics of the sputter-deposited, single crystal Pb$_{1-x}$Sn$_x$Te films. Thus, films having relatively low effective carrier concentrations can be produced under film deposition conditions, that is, selected temperatures and film growth rates, which would, except for the use of the dopant gas, produce electrically poor films. Moreover, the thus-produced monocrystalline films can be controlled as to type.

When substrate bias voltage is applied in the presence of the dopant gas, even lower effective n-type carrier concentrations can be provided and a change from an n-type to a p-type concentration can also be made through the application of the bias voltage. Accordingly, even greater flexibility is achievable through the joint use of the substrate bias voltage technique in the oxygen or nitrogen dopant gas of the present method to provide finished monocrystalline films having desired electrical properties relative to carrier type and concentration over a wide range of PbSnTe film compositions. For example, films with n-type film carrier concentrations in the $10^{-16}$cm$^{-3}$ range at 77° K and corresponding mobilities near or above $10^{-4}$v cm$^2$/second can readily be deposited without severe deposition control requirements by utilizing the dopant gas modification with bias voltage control technique. Moroever, no post-deposition annealing treatment is required if the dopant gas modification is applied.

Preparing Thin Film Pbsnte Sensors With High Photoconductive Responsivity

The present method, incorporating the above indicated procedures of growing thin film PbSnTe by sputtering in a low pressure environment comprised of argon or other inert sputtering gas and small concentrations of either oxygen or nitrogen provides a means for fabricating photoconductuve infrared sensors with selected spectral responses and with photoconductive responsivity exceeding that of PbSnTe sensors produced by any other method. Typically the photoconductive response of PbSnTe detectors is below 10 V/W at 77° K, with actual values depending on the response cutoff wavelength or the electro-optical energy gap of the sensor material. For example PbSnTe sensors with response cutoff at about 6μm have typical photoconductive responsivities of a few V/W and those with response cutoffs near 15μm have photoconductive responsivities below 1 V/W.

Figure 6:
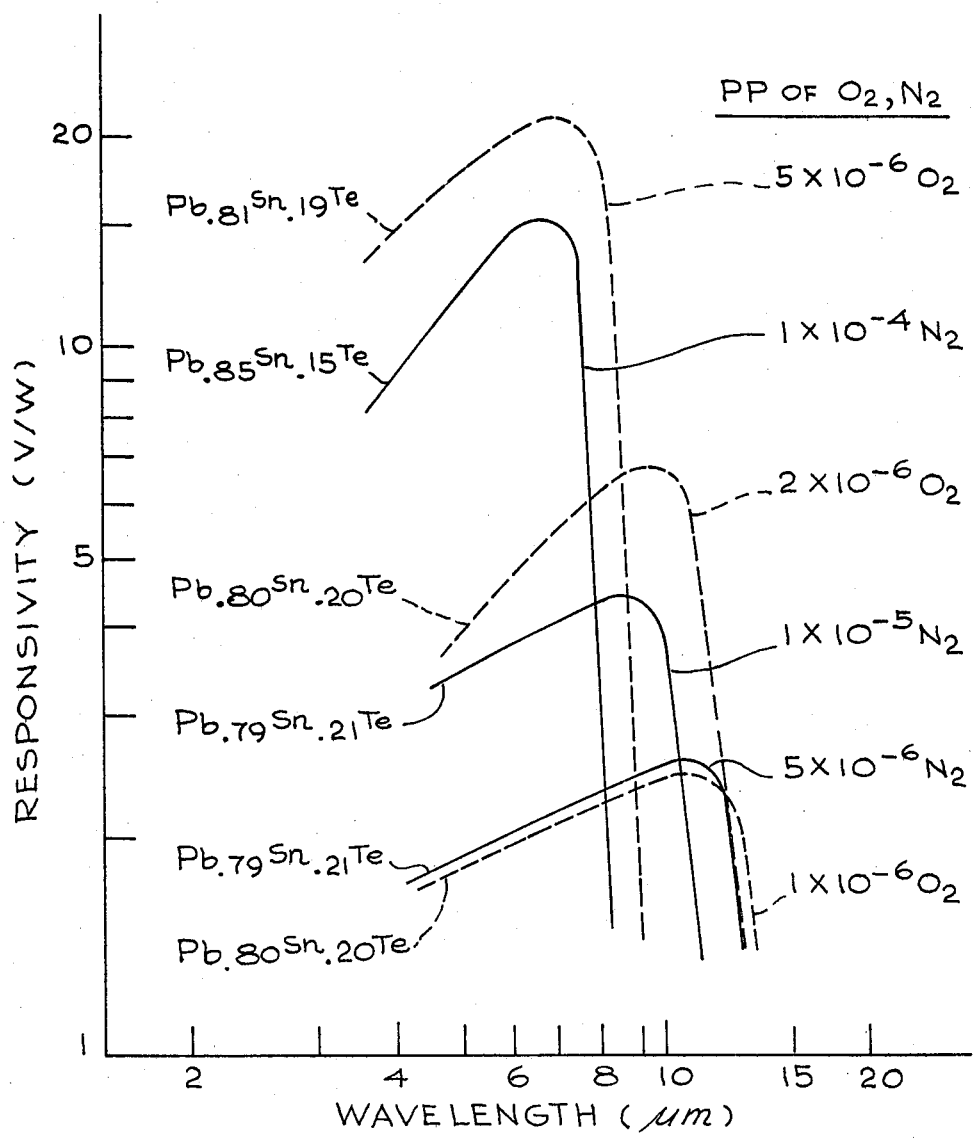
FIG. 6 is a graph showing the effect of sputtering gas additives on the photoconductive responsivity of sputtered PbSnTe film.

Referring more particularly to FIG. 6, a graph is shown which plots responsivity at operating temperatures of about 77° K as a function of wavelength of incident radiation for films sputtered with various concentrations of oxygen or nitrogen in the sputtering gas. Examination of the solid curves representing film sputtered in the presence of nitrogen and the dashed curves representing films sputtered in the presence of oxygen show a dependence of responsivity on the partial pressure of either gas as well as on the inherent dependence on composition or response cutoff wavelength. For example a comparison of the responsivity of film with composition Pb$_{.80}$Sn$_{.20}$Te shows that an increase in oxygen partial pressure from $1 \times 10^{-6}$ torr to $2 \times 10^{-6}$ torr leads to an increase in peak responsivity from about 2.5 v/w to about 7.0 v/w, without significantly affecting the response peak or cutoff wavelength. A further increase in oxygen partial pressure to $5 \times 10^{-6}$ torr in a film of similar composition Pb$_{.81}$Sn$_{.19}$Te produces film with a peak responsivity in excess of 20 v/w. A shift in response peak of the Pb$_{.81}$Sn$_{.19}$Te film to shorter wavelengths is observed which is in excess of that expected from the composition difference between Pb$_{.81}$Sn$_{.19}$Te film and Pb$_{0.80}$Sn$_{0.20}$Te film at 77° K. This shift in spectral response is typical for film sputtered with higher partial pressures of either dopant gas and is compensated for by altering the film composition in accordance with the criteria in FIG. 3, so that the final film has a preselected composition yielding the desired spectral response. Examining the data in FIG. 6 representing film sputtered in the presence of nitrogen partial pressures, indicated by solid lines, similar effects on responsivity are observed. For example, films with composition Pb$_{.79}$Sn$_{.21}$Te sputtered with partial nitrogen pressures of $5 \times 10^{-6}$ torr and $1 \times 10^{-5}$ torr shows peak responsivity from about 2.5 v/w to about 4 v/w along with a shift in peak response from about 12μm to 9μm. The final graph in FIG. 6 of a film grown with a nitrogen partial pressure of $1 \times 10^{-4}$ and a film composition Pb$_{.85}$Sn$_{.15}$ shows a peak responsivity of about 15 v/w. All responsivity values illustrated in FIG. 6 are derived from films without antireflection coatings. In a high index material such as PbSnTe ($n \geqq 6$) about 50% of the radiation incident on the surface will be reflected and therefore not contributing to the photoconductive response. Thus, detectors suitably configured with antireflection coatings transmission peaked at or near the response peak and using the films yielding the data in FIG. 6 have about twice the responsivity relative to the values given in FIG. 6 for uncoated films. For example, an optimized photoconductive detector using the film with composition Pb$_{.81}$Sn$_{.19}$Te in FIG. 6 will have a peak responsivity of about 40 v/w. Moreover, the responsivity data shown in FIG. 6 do not represent the maximum photoconductive responsivities resulting from the present method and only serve to illustrate the systematic dependence of photoconductive responsivity in PbSnTe film sputtered in the presence of partial pressures of oxygen or nitrogen.

The results of some measurements of electro-optical properties of sputtered PbSnTe film prepared in accordance with the described techniques utilizing dopant gas (oxygen or nitrogen) in addition to argon are set forth in Table I below:

TABLE I

Photoconductive Responses of Thin Film PB$_{1-x}$Sn$_x$Te Sensors Prepared with O$_2$ or N$_2$ Dopant Gas

| Sample No. | Film Composition X Value | pp O$_2$ (Torr) | pp N$_2$ (Torr) | Carrier Type |
|---|---|---|---|---|
| 21 | .19 | $5 \times 10^{-6}$ | | P |
| 22 | .20 | $2 \times 10^{-6}$ | | P |
| 23 | .20 | $1 \times 10^{-7}$ | | P |
| 24 | .15 | | $1 \times 10^{-4}$ | N |
| 25 | .21 | | $1 \times 10^{-5}$ | N |
| 26 | .21 | | $5 \times 10^{-6}$ | N |

| Sample No. | Cell Resistance | Bias Current | R Max (V/W) |
|---|---|---|---|
| 21 | 52KΩ | .06 ma | 20 |
| 22 | 610Ω | 5.7 ma | 7.2 |
| 23 | 350Ω | 10 ma | 2.2 |
| 24 | 32KΩ | 0.17 ma | 15 |
| 25 | 510Ω | 8 ma | 4 |
| 26 | 400Ω | 9 ma | 2.5 |

The examples of test results given in Table I correspond to sensors prepared with films of responsivity values similar to those in FIG. 6 and of a composition range $0.15 < x < 0.21$ where sensors prepared by other methods have photoconductive responsivity values in the neighborhood of 1 v/w.

The detector noise values of sensors with the range of properties indicated in Table I range from optimum values at the Johnson noise levels to maximum values not exceeding 10 nanovolt/hz$^{1/2}$ as measured at 77° K and at frequenceies above the $1/f$ noise dependence. Applying the measured noise values, sensors with properties similar to those given in FIG. 6 and Table I are calculated to have detectivities in the range from about $D^* = 5.0 \times 10^8$cm-Hz$^{1/2}$/W to $D^* \geqq 5 \times 10^9$cm-Hz$^{1/2}$/W above the $1/f$ noise frequency. These values already exceed those achievable with PbSnTe sensors produced by any other method, although measured with sensors having no antireflection coatings.

In Table II representative values of PbSnTe sensors with photoconductive responsivities higher than those illustrated in FIG. 6 and Table I are set forth which are more nearly indicative of the best sensors that can be produced by the present method using films prepared in accordance with the above indicated procedures including sputtering in the presence of partial pressures of oxygen or nitrogen.

TABLE II

Photoconductive Responses of Thin Film $Pb_{1-x}Sn_xTe$ Sensors Prepared with Optimum Concentrations of of $O_2$ or $N_2$ Dopant Gas

| Sample No. | Film Composition x Value | Carrier Type | Cell Resistance | Bias Current | Responsivity R Max V/W at 1 KHz |
|---|---|---|---|---|---|
| 16 | .05 | N | 1.6MΩ | 8μa | 420 |
| 17 | .05 | N | 0.9MΩ | 22μan | 65 |
| 18 | .07 | P | 300KΩ | 60μm | 25 |
| 19 | .12 | P | 950Ω | 11 ma | 3.9 |
| 20 | .07 | P | 400KΩ | 0.3 ma | 1055 |

Table II indicates high responsivity values of sputtered PbSnTe sensors representative of the low x value range $0.05 < x < 0.2$. Indications are that the observed enhanced photoresponsivities of these films are due to some form of carrier compensation. The as-deposited carrier concentrations in these films measured to as low as the $10^{14} cm^{-3}$ range.

Figure 7:
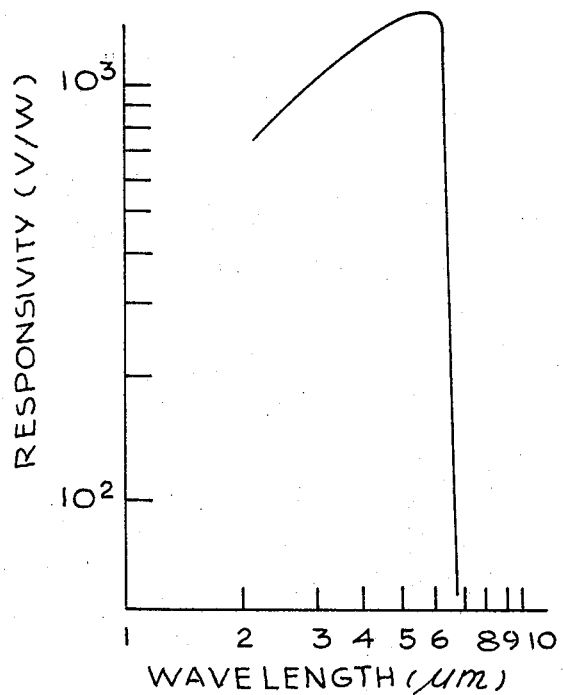
FIG. 7 is a graph plotting responsivity against wavelength for a selected high responsivity sputtered film.
Figure 8:
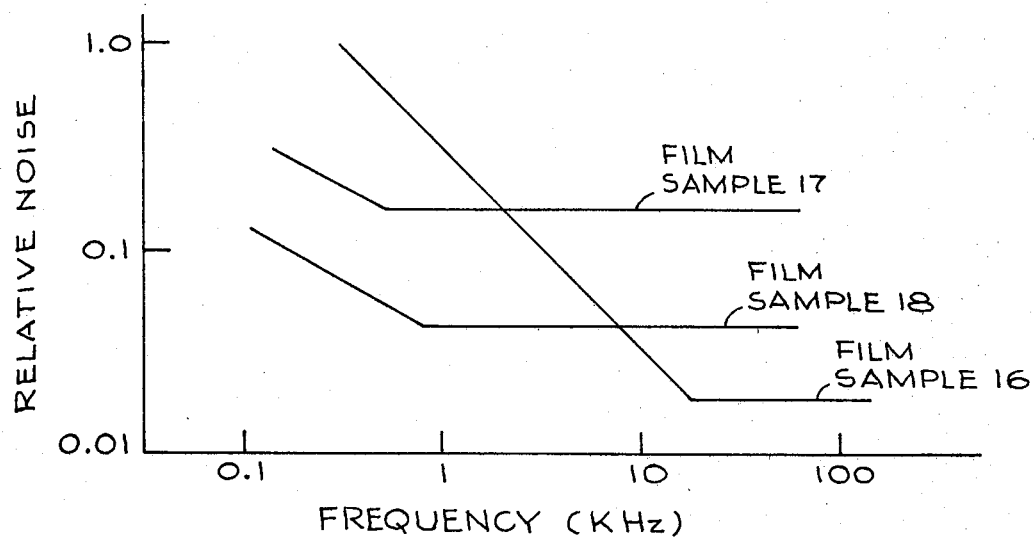
FIG. 8 is a graph plotting detector noise against frequency for three sputtered films having high responsivities.

The highest responsivity was obtained with sample 20, a remarkable 1055 v/w, as depicted in FIG. 7 wherein responsivity is plotted against wavelength. FIG. 8 sets forth the results of investigations of the noise levels with samples 16, 17 and 18. Thus, in FIG. 8 a graph is depicted wherein relative noise is plotted against frequency (KHz). In samples 17 and 18 the noise remained relatively constant from near 1 KHz to $10^5$ Hz and showed $1/f$ behavior below this frequency while in sample 16, the noise showed a $1/f$ dependence up to about $2 \times 10^4$ Hz. However, such a large $1/f$ noise frequency range is exceptional. In most samples tested, the noise remains constant to frequencies far below 1 KHz.

The detectivities of sensors with responsivity values of the range indicated in Table I are correspondingly higher than those for sensors representative of the responsivity values in Table I. Noise values range again from as low as 77° K Johnson noise to maximum values below 10 nanovolt/hz$^{1/2}$. Consequently, detectivity values at 77° K for samples of the type indicated in Table II range from $D^* > 5 \times 10^9 cm-Hz^{1/2}/W$ to $1.7 \times 10^{10} cm-Hz^{1/2}/W$ for sample 20 in Table II. For all detectivity tests a $2\pi$, 300° K background applies.

From the results set forth in FIG. 6 and Tables I and II, it can be stated that the high photoconductive response and detectivity of sensors in accordance with the present invention are systematic functions of the partial pressure of $O_2$ or $N_2$. Increasing partial pressures increase the photoconductive response. There is also a relationship between carrier concentration and type and the partial pressure of the dopant gas (see FIG. 4), and therefore a connection between carrier concentration and photoconductive response. It is postulated that use of $O_2$ or $N_2$ causes an effective increase in carrier lifetime as well as intrinsic carrier compensation, thus causing a reduction in effective carrier concentration.

Utilizing the described parameters in carrying out the method of fabricating the improved sensor of the present invention, it is preferred to first select the desired monocrystalline substrate and then the film growth rate and substrate temperature conditions which will yield a single crystal film (by reference to FIG. 2) of the desired composition or spectral response (by reference to FIG. 3) in view of the responsivity desired. The operating conditions of substrate temperature and film growth rate can also be selected so as to be conveniently carried out utilizing a conventional device such as the device 18 depicted in FIG. 1. Reference should then be made to FIGS. 4 and 5 for consideration of the proper partial pressure of dopant gas, oxygen or nitrogen and bias voltage if desired for achieving the desired carrier type, in depressing the carrier concentrations and thus adjusting the electro-optical characteristics of the deposited film to those which produce the highest photoconductive response to the highest quality sensors of the present invention.

Thus, improved photoconductive sensors in accordance with the present invention can be prepared utilizing the above-described techniques. Such sensors have improved electrical-optical characteristics in contrast to prior art devices prepared from similar materials. The sensors of the present invention can have cutoff wavelengths at 77° K of about 6μm-15μm which are directly relatable to and defined by the film composition and normally not by the $N_2$ or $O_2$ dopant gas (except at relatively high $N_2$ and $O_2$ partial pressures above $1 \times 10^{-5}$ torr and $5 \times 10^{-6}$ torr respectively.) Responsivity values, as pointed out above, also vary, with film composition being highest at shortest spectral peaks. Enhanced responsivity and detectivity characterize the sensors. Noise values in the best films approach Johnson noise in good detectors ($<5$ nV/Hz$^{1/2}$) at 77° K. $1/f$ noise can be limited to frequencies below 1Khz. Noise remains flat to 100Khz. Responsivities are typically flat from frequencies as low as 200 hz. Detector response times are fast (usually less than about 100 nanoseconds).

The described sputtering unannealed monocrystalline films as deposited on the monocrystalline substrates to form the present sensors can be fabricated into various devices in accordance with any suitable known technique. Thus, if a suitable shutter mask changer is available, ohmic contacts, anti-reflection coatings (if any) and the like can be deposited on the film-substrate composite sensor while the composite sensor is still in the sputter deposition device and while the low argon pressure is still in the system. Alternatively, ultra high vacuum deposition of ohmic contacts can be carried out in a separate vacuum deposition unit. Prior to removing the composite (film-substrate) from the sputtering chamber, the system usually is backfilled with inert dry gas. The composite is then transferred in a protective dry nitrogen bag or other enclosure to the ultra high vacuum station where ohmic contacts can be deposited at room temperature and a typical background pressure of about $1 \times 10^{-8}$ torr.

Several ohmic contact metals can be selected. Optimum results have been achieved to date with indium on n-type $Pb_{1-x}Sn_xTe$, and platinum on p-type $Pb_{1-x}Sn_xTe$. These contacts can be deposited with pads of sufficient thickness for attachment of leads. Obviously, the ohmic contacts deposited on the $Pb_{1-x}Sn_xTe$ films partially define the active area of the sensor and require corresponding tolerance control via masking and indexing precision.

The actual configuration of the detector, its active area and resistivity control via such conventional means as contact grids is determined by user requirements and is not part of the present invention.

Anti-reflection coatings are highly desirable in front-illuminated detectors due to the high index of refraction of $Pb_{1-x}Sn_xTe$ ($n \geq 6$) and consequent reflectivity. Suitable antireflection coatings are well known in the art and are not part of the present invention. Their thicknesses are defined by the spectral response band for which the detectors are tailored, using simple quarter-wavelength criteria.

Lead attachment is subject to user preference also. Satisfactory results can, for example, be achieved with ohmic platinum and/or indium contacts by attaching 0.005 inch diameter goldwires with indium solder. Thus, finished photoconductive devices having useful properties and incorporating the sensors of the present invention can be easily, simply and inexpensively prepared.

Various modifications, changes, alterations and additions can be made in the sensors of the present invention, their components and characteristics and their mode of preparation. All such modifications, changes, alterations and additions as are within the scope of the appended claims form part of the present invention.

What is claimed is:

1. An improved PbSnTe sputtered unannealed sensor having photoconductive response exceeding those of intrinsic PbSnTe sensors, said sensor comprising in combination:
   (a) a monocrystalline heat resistant substrate; and
   (b) a thin sputtered unannealed monocrystalline film on said substrate and having the formula $Pb_{1-x}Sn_xTe$ where $x$ is in the range from 0.0 to about 0.3, said film having a cutoff wavelength between about 6$\mu$m and about 15$\mu$m.

2. The improved sensor of claim 1 wherein said sensor has a photoconductive responsivity of up to about $10^3$ volts per watt at 77° K, a detectivity of up to about $1.5 \times 10^{10}$cm-Hz$^{1/2}$/W above the 1/f noise frequency, and a response time less than about 100 nanoseconds.

3. The improved sensor of claim 1 wherein said film has a thickness optimized for highest quantum efficiency and lowest detector noise and wherein said film has a low carrier concentration, a predetermined carrier type and high Hall mobility, said film being stable over a substantial period of time.

4. The improved sensor of claim 3 wherein $x$ has a value of between 0 and 0.3.

5. The improved sensor of claim 3 wherein said carrier concentration is in the range of about $10^{14}$–$10^{16}$cm$^{-3}$ at 77° K.

6. The improved sensor of claim 5 wherein said carrier concentration approaches $10^{14}$cm$^{-3}$ at 77° K.

7. The improved sensor of claim 5 wherein the noise value in said detector approaches Johnson noise and is less than about 5 nV/Hz$^{1/2}$ at 77° K.

8. The improved sensor of claim 3 wherein said film has a thickness between about 1$\mu$m and about 2$\mu$m.

9. The improved sensor of claim 1 wherein said substrate is selected from the group consisting of calcium fluoride and barium fluoride.

10. The improved sensor of claim 9 wherein said substrate is calcium fluoride.

11. The improved sensor of claim 9 wherein said substrate is barium fluoride.

12. An improved thin film photoconductive sensor comprising, in combination:
   (a) a heat resistant insulating substrate of a selected single crystal material; and
   (b) a thin sputtered unannealed monocrystalline film on said substrate comprising $Pb_{1-x}Sn_xTe$ where $x$ is in the range from 0.0 to about 0.3, said film having a cutoff wavelength between about 6$\mu$m and about 15$\mu$m, a photoconductive responsivity of up to about $10^3$V/watt at 77° K with a detectivity of up to about $1.5 \times 10^{10}$cm-Hz$^{1/2}$/W above the 1/f frequency, and a response time less than 100 nanoseconds, said film thickness being about 1–2$\mu$m so that the 1/f noise frequency is below about 1 KHz, said film having been sputtered in the presence of a dopant gas selected from the group consisting of nitrogen and oxygen, at a partial pressure in the case of oxygen of up to about $5 \times 10^{-6}$ torr and at a partial pressure in the case of nitrogen of up to about $1 \times 10^{-5}$ torr, and an argon environment at total pressures in the range from 0.5 to 5$\mu$m onto said substrate at a substrate temperature of between about 220° and about 350° C at a film growth rate between about 0.1–3.0$\mu$m/hr, said substrate temperature and film growth rate having been selected to provide a monocrystalline film of desired composition, a substrate bias voltage of between about +30 and −30 volts having been applied during said sputtering, whereby minimum carrier concentration of selected type, maximum mobility and improved responsivity are provided for the film.

13. The improved sensor of claim 12 wherein said substrate material is selected from the group consisting of calcium fluoride and barium fluoride.

14. The improved sensor of claim 13 wherein said substrate material is calcium fluoride.

15. The improved sensor of claim 13 wherein said substrate material is barium fluoride.

* * * * *